(12) United States Patent
Ishimatsu

(10) Patent No.: US 6,527,984 B1
(45) Date of Patent: Mar. 4, 2003

(54) LOW TEMPERATURE-CURABLE CONNECTING MATERIAL FOR ANISOTROPICALLY ELECTROCONDUCTIVE CONNECTION

(75) Inventor: Tomoyuki Ishimatsu, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/693,103

(22) Filed: Oct. 20, 2000

(30) Foreign Application Priority Data

Oct. 22, 1999 (JP) .......................................... 11-301461

(51) Int. Cl.⁷ ................................................ H01B 1/20
(52) U.S. Cl. ......................... 252/500; 525/88; 525/94; 525/242
(58) Field of Search ........................ 525/88, 94, 242; 252/500

(56) References Cited

U.S. PATENT DOCUMENTS

| | | |
|---|---|---|
| 4,701,279 A | 10/1987 | Kawaguchi et al. |
| 5,330,684 A | 7/1994 | Emori et al. |
| 6,039,896 A | 3/2000 | Miyamoto et al. |

FOREIGN PATENT DOCUMENTS

| | | |
|---|---|---|
| EP | 0 883 329 | 12/1998 |
| EP | 1 076 082 | 2/2001 |
| JP | 10 147762 | 6/1998 |
| JP | 10 168412 | 6/1998 |

*Primary Examiner*—Jeffrey Mullis
(74) *Attorney, Agent, or Firm*—Flynn, Thiel, Boutell & Tanis, P.C.

(57) ABSTRACT

A low temperature-curable connecting material for anisotropically electroconductive connection, which can be cured at lower temperature with reduction of shrinkage of the material upon curing, whereby an accumulation of internal stresses is avoided to thereby increase the bonding strength and the reliability of electric continuity in the connection while securing an electrically insulating separation between the neighboring electrodes, the connection material comprising an adhesive mass for bonding and connecting elements having electrodes thereon in a correspondingly confronting relationship, wherein the adhesive mass comprises

- a polymerizable component subject to radical polymerization and to cross-linking,
- a polymerization initiator and
- a block copolymer having a segment compatible with the polymerizable component and a segment incompatible with the polymerizable component.

12 Claims, No Drawings

LOW TEMPERATURE-CURABLE CONNECTING MATERIAL FOR ANISOTROPICALLY ELECTROCONDUCTIVE CONNECTION

FIELD OF THE INVENTION

The present invention relates to a low temperature-curable connecting material for anisotropically electroconductive connection to be used for bonding and connecting elements together, each element having a plurality of electrodes opposite to those on a counter element, in particular, a low temperature-curable connecting material containing a polymerizable component subject to radical polymerization.

DESCRIPTION OF THE RELATED TECHNIQUES

It has become a practical trend to use, as a material for connecting an element having a plurality of electrodes confronting correspondingly to electrodes on another element to be connected therewith, an anisotropically electroconductive connecting material, such as an anisotropically electroconductive film (ACF) and an anisotropically electroconductive paste (ACP) as a substitute for conventional solder. The anisotropically electroconductive material is prepared by dispersing electroconductive particles in an adhesive component constituted mainly of a thermosetting resin and is used for bonding and electroconductively connecting elements together, each element being provided on an opposing face with a plurality of electrodes, by interposing the anisotropically electroconductive material between the elements and subjecting the resulting assemblage to a heat-pressing, in order to effect electroconductive connection between the correspondingly confronting electrodes by establishment of frictional contact of the confronting electrodes with the electroconductive particles bridging therebetween, on the one hand, and to build up an assured insulating separation between the neighboring electrodes, on the other hand, together with firm mechanical bonding of the elements with each other by causing the thermosetting resin to cure. When the electrodes have a smaller connecting surface area, a connecting material not containing electroconductive particles may be used. Here also, the electroconductive connection and the mechanical bonding are realized in the same manner.

The anisotropically electroconductive connecting material can provide secure electroconductive connection between the correspondingly confronting electrodes and build up an assured insulating separation between the neighboring electrodes. The anisotropically electroconductive connecting material has been used for assembling a semiconductor element or package on a printed circuit board or for connecting a printed circuit board with another printed circuit board, such as a flexible printed circuit board or, further, in an ordinary liquid crystal display arrangement.

On realizing an electroconductive connection between the electrodes on, for example, printed circuit boards having micronous circuits using conventional anisotropically electroconductive connecting material, a sufficient connection reliability and a satisfactory bonding strength are attained by effecting the curing reaction of the thermosetting resin at a temperature of 150–200° C. for a time period of about 20 seconds to cause the curing reaction to proceed sufficiently. Recently, however, demand for connecting between micronous circuits with each other has become increased due to the general trend to precise and thin design of electronic devices and instruments. In order to meet this requirement, it has highly been expected to develop an anisotropically electroconductive connecting material capable of both establishing a highly insulating separation between the neighboring micronous electrodes and reducing the occurrence of damage upon heat-pressing. In addition, it has in recent years become practiced increasingly to assemble a circuit board or the like having micronous circuits on a large connecting substrate panel, where a connection by heating at a temperature over 150° C. may cause a large thermal deformation or warp, resulting in a considerable disorder in the dimensional stability, which has been taken up as a troublesome problem and, thus, a demand for an anisotropically electroconductive connecting material operable at a lower temperature has been brought about.

It has been proposed, for example, in Japanese Patent Kokai Hei 10-147762 A, a connecting material permitting such a lower temperature connection, in which a radical polymerization resin is incorporated. The connecting material is in a form of an anisotropically electroconductive film and comprises an adhesive mass and, dispersed therein, electroconductive particles, wherein the adhesive mass comprises a polymerizable component subject to cross-linking and to radical polymerization, an organic peroxide and a thermoplastic elastomer. This connecting material can attain a low temperature connection by heating at a lower temperature or by irradiation of light to cause radical polymerization and cross-linking, whereby a low temperature curing is realized.

However, use of such a polymerizable material subject to radical polymerization may tend to cause the cured mass to fall off due to accumulation of internal stresses at the bonded site after the curing, since the shrinkage of the cured resin by radical polymerization is greater than that of a conventionally used thermosetting resin, such as an epoxy resin or the like, so that an increase in the bonding strength may not be expected. This leads also to a difficulty in increasing the reliability of establishment of electric continuity and, in addition, tends to cause deterioration of these characteristic properties for a successive long term service. Thereto is further added the fact that the adhesive used for bonding the electrode onto the printed circuit substrate board softens on such a connection procedure, so that the electrodes are apt to displace in accompaniment with the shrinkage of the connecting material. When the electrodes are arranged at a small interval, the shrinkage of the connecting material causes a further reduction of the electrode interval, whereby the electroconductive particles present within the interval space may, on certain occasions, come into frictional contact with the neighboring electrodes to bridge therebetween, resulting in short circuiting. For obviating such a difficulty, a thermoplastic elastomer is incorporated. However, there may occur a possible phase separation of the thermoplastic elastomer from the polymerizable component subject to radical polymerization, resulting also in a reduction of the bonding strength.

SUMMARY OF THE INVENTION

An object of the present invention is to provide a low temperature-curable anisotropically electroconductive connecting material which can be cured at a lower temperature with a reduction of shrinkage of the material upon the curing, whereby an accumulation of internal stresses is avoided to thereby increase the bonding strength and the reliability of electric continuity at the junction while securing electric insulating separation between the neighboring electrodes and maintaining these characteristic features for a long time.

The present invention resides in the following low temperature-curable anisotropically electroconductive connecting material:

(1) A low temperature-curable connecting material for anisotropically electroconductive connection, comprising an adhesive mass for bonding and connecting elements, each having electrodes thereon in a correspondingly confronting relationship, wherein the adhesive mass comprises a polymerizable component subject to radical polymerization and cross-linking, a polymerization initiator and an A-B-type block-copolymer having a segment compatible with the polymerizable component and a segment incompatible with the polymerizable component.

(2) The low temperature-curable connecting material as defined in the above (1), wherein the polymerizable component comprises a polymerizable coupling agent.

(3) The low temperature-curable connecting material as defined in the above (1) or (2), wherein the block-copolymer is a polystyrene/polyvinyl acetate block-copolymer or a polystyrene/poly(meth)acrylate block-copolymer.

(4) The low temperature-curable connecting material as defined in any one of the above (1) to (3), wherein the adhesive mass contains the polymerizable component in a proportion of 10–90% by weight, the polymerization initiator in a proportion of 1–10% by weight and the block-copolymer in a proportion of 9–80% by weight.

(5) The low temperature-curable connecting material as defined in any one of the above (1) to (4), wherein the adhesive mass contains a thermoplastic resin in a proportion of 0–50% by weight.

(6) The low temperature-curable connecting material as defined in any one of the above (1) to (5), wherein it further comprises electroconductive particles in an amount of 0–50%, based on the volume of the adhesive mass.

DETAILED DESCRIPTION OF THE DISCLOSURE

The elements to be bonded and connected by the low temperature-curable connecting material according to the present invention are devices and members, each having thereon a plurality of electrodes in a correspondingly confronting relationship including, for example, semiconductors and printed circuit substrate boards. As the semiconductors, semiconductor elements, such as IC chips, may favorably serve as the objective of the present invention, while the connecting material according to the present invention may also be applied to packages. As the substrate board, there may be exemplified a glass/epoxy composite board, glass board, resin board and flexible board. The application of the low temperature-curable connecting material according to the present invention is directed to an anisotropically electroconductive connection between a printed circuit substrate board and a semiconductor element or between two substrate boards, as in the case of anisotropically electroconductively connecting a printed circuit board assembled with a semiconductor(s) to a flexible substrate board.

The low temperature-curable connecting material for anisotropically electroconductive connection according to the present invention can afford secure electroconductive connection between the correspondingly confronting electrodes on the elements to be bonded together, on the one hand, and assure electroinsulating separation between the neighboring electrodes, on the other hand. In the adhesive mass of the connecting material, a polymerizable component subject to radical polymerization and to cross-linking linking is incorporated. The polymerizable component has one or more unsaturated bonds to be subjected to radical polymerization. While the polymerizable component may favorably have two or more polymerization-permitting unsaturated bonds for attaining cross-linking of the polymerized resin, the cross-linking may be effected otherwise by, for example, ester bonds, urethane bonds or so on, through functional groups other than double bonds. The polymerizable component can perform the contemplated polymerization under curing by incorporating in the low temperature-curable connecting material a polymerization initiator, such as a radical polymerization initiator or a photo polymerization initiator.

As the polymerizable component subject to radical polymerization, any compound having one or more polymerization-permitting unsaturated double bonds in the molecule may be used without restriction. Examples thereof include prepolymers subject to radical polymerization of, for example, vinyl ester resins, diallyl phthalate resin, acrylate resins, maleimide resins and unsaturated polyester resins; monomers subject to radical polymerization; and coupling agents subject to radical polymerization. By using, in particular, a vinyl ester prepolymer resin obtained by reacting an epoxy resin with acrylic or methacrylic acid or by reacting an epoxy resin with acrylic or methacrylic acid or by reacting glycidyl methacrylate with polyvalent phenol, a low temperature-curable connecting material for anisotropically electroconductive connection in a form of film exhibiting curability and storage stability, which will bring about a cured layer exhibiting heat resistance, resistance to moisture and resistance to chemicals, can be obtained. They may be incorporated in the connecting material either solely or in a combination of two or more of them such as those having different molecular weights. It is permissible to incorporate the preliminary addition of a polymerization inhibitor, such as a quinone compound or a phenol, in order to increase the storage stability.

As the monomers subject to radical polymerization, there may be employed monomers having one or more polymerizable unsaturated double bonds in the molecule, examples or which include styrene, methyl-styrene, methyl methacrylate, ethyl methacrylate, n-butyl methacrylate, isobutyl methacrylate, 2-ethyl-hexyl methacrylate, isodecyl methacrylate, n-lauryl methacrylate, tridecyl methacrylate, n-stearyl methacrylate, cyclohexyl methacrylate, tetrahydrofurfuryl methacrylate, isobornyl methacrylate, benzyl methacrylate, 2-hydroxyethyl methacrylate, 2-hydroxypropyl methacrylate, 2-hydroxybutyl methacrylate, dimethylaminoethyl methacrylate, diethylaminoethyl methacrylate, glycidyl methacrylate, ethylene glycol dimethacrylate, diethylene glycol dimethacrylate, 1,4-butanediol dimethacrylate, 1,6-hexanediol dimethacrylate, tert-butyl methacrylate, isostearyl methacrylate, behenyl methacrylate, n-butoxymethyl methacrylate, 2-phenoxyethyl methacrylate, glycerol monomethacrylate, 2-hydroxy-3-acryloyloxypropyl methacrylate, 3-chloro-2-hydroxypropyl methacrylate, 1,3-butanediol dimethacrylate, neopentyl glycol dimethacrylate, 1,10-decanediol dimethacrylate, dibromoneo-pentyl glycol dimethacrylate, trichloroethyl methacrylate, 2,2,3,3-tetrachloropropyl methacrylate, 2,2,3,4,4-tetrafluoropropylbutyl methacrylate, perfluorooctylethyl methacrylate, 3-chloro-2-hydroxypropyl methacrylate, stearyl methacrylate, lauryl acrylate, carbonyl diacrylate, ethylene oxide-modified bisphenol A diacrylate, ethylene oxide-modified bisphenol F diacrylate, ethylene oxide-modified p-cumylphenol acrylate, polypropylene glycol diacrylate, isocyanuric acid ethylene oxide-modified diacrylate, isoamyl acrylate, lauryl acrylate, stearyl acrylate, butoxyethyl acrylate, phenoxyethyl acrylate, tetrahydrofurfuryl acrylate, isobornyl acrylate, 2-hydroxyethyl acrylate, 2-hydroxypropyl acrylate, 2-hydroxy-3-phenoxypropyl acrylate, neopentyl glycol diacrylate, 1,6-hexanediol diacrylate, isooctyl acrylate, benzyl acrylate, nonylphenoxyethyl acrylate, ethylene oxide-modified nonylphenol acrylate, propylene oxide-modified nonylphenol acrylate, 2-hydroxybutyl acrlylate, perfluorooctylethyl acrylate, dimethyloltricyclodecane diacrylate, 2-acryloyloxyethyl acid phosphate, mono(2-acryloyloxyethyl) acid phosphate, mono (2-methacryloyloxyethyl) acid phosphate, 2-methacryloyloxyethyl-2-hydroxypropyl phthalate, β-methacryloyloxyethyl hydrogenphthalate, β-methacryloylethyloxy hydrogensuccinate, β-acryloyloxyethyl hydrogensuccinate, 2 hydroxy-1,3-dimethanefuroxypropane, dimethylacrylamide, acryloylmorpholine, N-vinyl-2-pyrrolidone, ethylene glycol-modified isocyanuric acid triacrylate, 2-acryloyloxyethyl succinate, 2-acryloyloxyethyl phthalate, methacrylic acid, succinic acid and phthalic acid. By incorporating these monomers subject to radical polymerization in the polymerizable component, it is made possible to improve the workability, flowability upon curing, flexibility during curing and tight fit onto the element to be bonded. They may be employed either alone or in a combination of two or more of them. For attaining a cross-linking ability of the adhesive mass, it is possible to use a monofunctional monomer having one polymerizable unsaturated bond in combination with a di- or polyfunctional monomer having two or more polymerizable unsaturated bonds.

As the coupling agents subject to radical polymerization, there may be recited, for example, vinyltrichlorosilane, vinyltris(β-methoxyethoxy)silane, vinyltriethoxysilane, vinyltrimethoxysilane, γ-(methacryloyloxypropyl) trimethoxysilane, β-(3,4-epoxycyclohexyl) ethyltrimethoxysilane, γ-glycidyloxypropyltrimethoxysilane, γ-glycidoxypropylmethyldiethoxysilane, N-β(aminoethyl)γ-aminopropyltrimethoxysilane, N-β-(aminoethyl)γ-aminopropylmethyldimethoxysilane, γ-aminopropyltriethoxysilane, N-phenyl-γ-aminopropyltrimethoxysilane, γ-mercaptopropyltrimethoxysilane and γ-chloropropyltrimethoxysilane. As the coupling agent based on titanate, there may be recited, for example, isopropyltriisostearoyl titanate, isopropyltri-n-dodecylbenzenesulfonyl titanate, isopropyltris(dioctyl pyrophosphate) titanate, tetraisopropylbis(dioctylphosphite) titanate, tetraoctylbis(di-tridecylphosphite) titanate, tetra(2, 2-diallyloxymethyl-1-butyl)bis(di-tridecyl) phosphate titanate, bis(dioctylpyrophosphate) oxyacetate titanate, bis (octylpyrophosphate)ethylene titanate, isopropyltrioctanoyl titanate, isopropyldimethacryloylisostearoyl titanate, isopropylisostearoyldiacryl titanate, isopropyltri(dioctyl phosphate) titanate, isopropyltricumylphenyl titanate and isopropyltri(N-aminoethyl-aminoethyl) titanate. By incorporating these coupling agents, it is possible to obtain a connecting material exhibiting improved adhesion onto inorganic substances, in particular, onto a glass surface of, for example, an LCD, so that it is possible to improve the bonding strength of the connecting material. An increase in the reliability may also be expected, since an improvement in the heat resistance and in the resistance to moisture may be prospective.

As the radical polymerization initiator, there may be employed, for example, organic peroxides.

As the organic peroxides, there may be recited, for example, methyl ethyl ketone peroxide, cyclohexanone peroxide, methyl cyclohexanone peroxide, isobutyryl peroxide, 3,5,5-trimethylhexanoyl peroxide, lauroyl peroxide, benzoyl peroxide, p-chlorobenzoyl peroxide, acetylcyclohexanesulfonyl peroxide, tert-butyl hydroperoxide, cumene hydroperoxide, di-isopropylbenzene hydroperoxide, p-mentane hydroperoxide, 2,5-dimethylhexane-2,5-dihydroperoxide, 1,1,3,3-tetramethylbutyl hydroperoxide, di-tert-butyl peroxide, tert-butyl-α-cumyl peroxide, 1,4-(or 1,3-)bis{(tert-butyldioxy) isopropyl}benzene, 2,5-dimethyl-2,5-bis(tert-butylperoxy)-hexane, 2,5-dimethyl-2,5-bis(tert-butylperoxy)-3-hexane, 1,1-bis(tert-butylperoxy)-3,3,5-trimethylcyclohexane, n-butlyl-4,4-bis(tert-butylperoxy)valerate, 2,2-bis(tert-butylperoxy)butane, tert-butyl peroxyacetate, tert-butyl peroxyisobutyrate, tert-butyl peroxyoctoate, tert-butyl peroxypivalate, tert-butyl peroxyneodecanoate, tert-butyl-peroxy-3,5,5-trimethyl hexanoate, tert-butyl peroxybenzoate, tert-butyl peroxylaurate, 2,5-dimethyl-2,5-bis(benzoylperoxy)hexane, bis(2-ethylhexyl) peroxydicarbonate, diisopropyl-oxy dicarbonate, di-sec-butyl peroxydicarbonate, bis(3-methoxybutyl) peroxydicarbonate, bis(2-ethoxyethyl) peroxydicarbonate, bis(4-tert-butylcyclohexyl) peroxydicarbonate, O,O-tert-butyl-O-isopropyl peroxycarbonate and succinic acid peroxide.

For improving the storage stability of these organic peroxides, it is possible to admix a varying kind of polymerization inhibitor with the organic peroxide product before incorporation in the connecting material. It is also possible to incorporate two or more organic peroxides in combination. In order to accelerate the polymerization, the connecting material according to the present invention may further contain a polymerization accelerator, for example, an organic metal salt, such as cobalt naphthenate, manganese naphthenate or vanadium pentoxide; and an amine, such as an aliphatic amine, an aromatic amine (such as dimethylaniline) or an imidazole compound (including a latent accelerator, such as an amine adduct or a microcapsulated product).

As the photo-polymerization initiator, for example, α-ketocarbonyl compounds, such as diacetyl, 2,3-pentanedione, benzil, dimethoxybenzil, 4,4-dichlorobenzil and camphorquinone, may be recited. By admixing such a photo-polymerization inhibitor with the adhesive mass of the connecting material according to the present invention, photo-polymerization can be effected by irradiating the connecting material with a ray in a range from the ultraviolet region to the region of visible light.

The A-B type block-copolymer to be incorporated in the connecting material according to the present invention has a segment compatible with the above described polymerizable component and a segment incompatible with the polymerizable component so as to build up a molecular structure of A-B. For such a block-copolymer, there may be employed, for example, polystyrene/polyvinyl acetate block-copolymer and polystyrene/poly(meth)acrylate block-copolymer. As the poly(meth)acrylate, there may be recited, for example, polymethacrylates and polyacrylates, such as polymethyl methacrylate, polypropyl methacrylate, polymethyl acrylate and polypropyl acrylate. The compatible segment of the block-copolymer is a polymer block compatible with the polymerizable component subject to radical polymerization and with the polymerization product thereof, whereas the incompatible segment is a polymer block incompatible with the polymerizable component and the polymerization product, wherein the block having an SP value (solubility parameter) closer to that of the polymerizable component or its polymerized product constitutes the compatible segment and the block having an SP value far from that of the polymerizable component and its polymerized product constitutes the incompatible segment. This parameter is based on a relative concept and may vary in accordance with each specific kind, composition, blended proportion and so on of the polymerizable component constituting the adhesive mass.

When the thermoplastic resin, which will be described afterwards, is incorporated in the adhesive mass, a phase separation between the thermoplastic resin and the polymerizable component or its polymerized product can be prevented by selecting the A-B type block-copolymer having an incompatible segment which is compatible with the thermoplastic resin or by a concurrent use of a block-copolymer which has a segment compatible with the polymerizable component and a block-copolymer which has a segment compatible with the thermoplastic resin.

Due to the molecular structure of the block-copolymer having compatible and incompatible segments, as in a surfactant, it functions in a manner similar to a surfactant. It is well known that a surfactant, when present in water at a higher concentration, will form a so-called micelle in which molecules of the surfactant align in a head-out and tail-in posture surrounding a microspherical mass of water. In the case of the A-B-type block-copolymer also, it forms micelles within the adhesive mass. When the polymerizable component subject to radical polymerization and the block-copolymer are present concurrently, the block-copolymer will align on the micelle in a posture of the compatible segment being outwards and the incompatible segment being inwards. When the adhesive mass is cross-linked, namely polymerized and cured, the polymerizable component will cure within the interstices between these micelles while being grasped by the solidified micelles, whereby the volumetric shrinkage upon the curing is suppressed. In the case where the SP value of the polymerizable component subject to radical polymerization may change before and after the polymerization, a microphase conversion may occur also in the micelles between the compatible segment and the incompatible segment, wherein the granular structure due to the micelles are retained as a whole.

While the weight proportion of the A-segment and the B-segment in the A-B-type block-copolymer may not be specifically restricted, it may favorably be in the range from 90:10 to 10:90, preferably from 80:20 to 20:80. The weight-average molecular weight of the block-copolymer may favorably be in the range from 100,000 to 500,000, preferably from 150,000 to 300,000. For such a block-copolymer, commercial products may be employed.

According to the present invention, the low temperature-curable connecting material may be prepared so as to reveal an ability of being coated on a substrate and a film-forming property together with the attainment of a reduction of internal stress accumulation and improvement in the bonding strength, by incorporating the thermoplastic resin in the adhesive mass thereof.

As the thermoplastic resin, there may be recited, for example, resins made mainly of polyester, polyimide, polyamide, polybutadiene, polypropylene, acrylonitrile, silicone, polyurethane, phenoxy and polyamide (nylon). Further, resins having various functional groups, such as carboxyl, hydroxyl and glycidyl may also be employed. Among them, those modified by a carboxyl group or hydroxyl group may exhibit superior characteristic features in adhesive performance and establishment of an assured electric continuity at the junction.

In the low temperature curable connecting material according to the present invention, various additives, such as a filler, surfactant, coupling agent, antioxidant and so on, may be incorporated. Here, the coupling agent as given herein is incorporated when the coupling agent subject to radical polymerization is not incorporated, for which those coupled through a bonding other than that of radical polymerization, such as an ester bond or the like, may be employed.

The adhesive mass constituting the low temperature-curable connecting material for anisotropically electroconductive connection according to the present invention comprises the above-mentioned various components. The proportions of the constituent components thereof may be from 10 to 90% by weight, preferably from 20 to 80% by weight, of the polymerizable component subject to radical polymerization; from 1 to 10% by weight, preferably from 2 to 5% by weight, of the polymerization initiator; and from 9 to 80% by weight, preferably from 18 to 70% by weight, of the block-copolymer. The content of the thermoplastic resin in the adhesive mass may be from 0 to 50% by weight, preferably from 0 to 40% by weight. The content of the di- or polyfunctional polymerizable component in the polymerizable component subject to radical polymerization may favorably be not lower than 10% by weight, preferably not lower than 20% by weight and the polymerizable coupling agent in the polymerizable component may favorably be in the range from 1 to 10% by weight, preferably from 1 to 5% by weight.

The low temperature-curable connecting material according to the present invention may comprise, in addition to the above-mentioned adhesive mass, electroconductive particles. When the junction area of each electrode is not higher than 10,000 $\mu m^2$, a secure electroconductive connection between the confronting electrodes can be realized without incorporating the electroconductive particles while the reliability of the electroconductive connection may be increased by incorporating the electroconductive particles when the junction area of the electrode is greater than the above-given value. As the electroconductive particles, any having electroconductive properties may be used without restriction, while there may be exemplified simple substances of metals, such as nickel, iron, gold, silver, copper, aluminum, chromium, cobalt, lead and tin; alloys; metal oxides; electroconductively coated particles obtained by coating each particle of, for example, these simple substances of metals, carbon, graphite, glass, ceramics and plastics, with a layer of a metal; and particles prepared by coating the electroconductive particle with a layer of an electric insulating material, such as a thermoplastic insulating resin.

The electroconductive particles may have a particle size in the range from 0.5 to 50 $\mu m$, preferably from 1 to 30 $\mu m$, wherein the proportion of the electroconductive particles to the adhesive mass may amount to 0–50%, preferably 0–30%, based on the volume of the adhesive mass.

The low temperature-curable connecting material according to the present invention may be in a form of a paste or a sheet. For preparing a paste, it may be possible to formulate the connecting material in a form of a paste without using an y solvent by selecting adequately the constituent components.

For preparing in a form of a sheet, an exfoliative film is coated with the paste prepared as above and drying the resulting layer to leave the material in a form of a sheet on the exfoliative film.

The connecting material according to the present invention is placed between the elements to be bonded, for example, a substrate circuit board and a semiconductor element, both being provided on opposing faces with a plurality of electrodes in a correspondingly confronting relationship, whereupon the resulting assemblage is pressed from both sides with heating or under irradiation of light to cause the adhesive mass to harden to thereby attain connection therebetween. In the case of the connecting material being in the form of a paste, the semiconductor element and the substrate circuit board are coated over their areas to be bonded, including the electrodes, with the paste and the resulting assemblage is pressed together from both sides with or without drying the coated layer to cause hardening of the adhesive mass to effect their bonding. In the case of using the connecting material in the form of a sheet, the sheet is interposed between the semiconductor element and the substrate circuit board and the resulting assemblage is pressed together and the adhesive mass is subjected to curing by applying heat or irradiating with a ray. The curing may be effected, in the case where a radical polymerization initiator is employed, by heating the assemblage for a period of time of 10–30 seconds at a temperature of 100–150° C., or, when a photo-polymerization initiator is employed, by irradiating the connecting material with a ray, such as an ultraviolet ray.

In the connecting step given above, the connecting material according to the present invention is placed in between, for example, the substrate circuit board and the semiconductor element, both being provided on opposing faces with a plurality of electrodes in a correspondingly confronting relationship, whereupon the resulting assemblage is pressed, if necessary, with heating, from both sides to cause the adhesive mass to first melt and expel aside to fill up the free space between the adjacent electrodes while the electroconductive particles retained in between the confronting electrodes are seized by these electrodes by being pressed thereonto to bridge electroconductively therebetween, before the thermosetting resin in the adhesive mass is cured to build up a solid connected assembly. The adhesive mass expelled to the free space between the adjacent electrodes is cured there by radical polymerization to bond the substrate board and the semiconductor element. In this manner, the electric connection between the confronting electrodes and the mechanical bonding of the substrate board with the semiconductor element are attained at the same time, while maintaining the electric insulation between the neighboring electrodes. In the case where the junction area of the electrode is not greater than 10,000 $\mu m^2$, it is possible to use the low temperature-curable connecting material according to the present invention which has no electroconductive particles, wherein the confronting electrodes are brought into frictional contact directly and the interstitial regions between the neighboring electrodes share the bonding strength of the connection by adhesion after the curing of the connecting material.

Using the low temperature-curable connecting material according to the present invention, curing of the connecting material can be realized at a lower temperature, since the polymerization with cross-linking is performed by radical polymerization of the polymerizable component, whereby possible heat damage of the connected assembly by high-temperature curing can be reduced. Further, the use of the block-copolymer reduces the shrinkage of the adhesive mass upon the curing despite the polymerization being effected by radical polymerization, whereby accumulation of internal stresses is reduced and the bonding strength can thereby be increased with an increased reliability of the establishment of secure electric continuity in the connection between the confronting electrodes. Moreover, the neighboring electrodes are maintained under high electric insulating separation and are prevented from short-circuiting due to the shrinkage of the interspace between the neighboring electrodes. The connecting material according to the present invention can maintain these advantageous features for a long time and permits use under a moist and hot condition for a long period of time.

THE BEST MODE FOR EMBODYING THE INVENTION

Below, the present invention will further be described by way of Examples and Comparative Examples.

EXAMPLES 1 to 8, COMPARATIVE EXAMPLES 1 to 6

By compounding a commercial product of ethylene glycol-modified bifunctional bisphenol A diacrylate (a product of Toagosei Chemical Industry Co., Ltd., with the trade name M-210) as the polymerizable component A constituting the polymerizable component subject to radical polymerization, a commercial product of ethylene glycol-modified trifunctional isocyanuric acid triacrylate (a product of Toagosei Chemical Industry Co., Ltd., with the trade name M-315) as the polymerizable component B constituting the polymerizable component subject to radical polymerization, monolauroyl peroxide as the peroxide for the radical polymerization initiator, a commercial silane coupling agent (a product of Nippon Unicar Co., Ltd., with the trade name A151) as the coupling agent subject to radical polymerization, a commercial polystyrene/polyvinyl acetate block-copolymer (a product of Nippon Oil & Fats Co., Ltd., with the trade name MODIPER SV10B) as the copolymer A of the A-B-type block-copolymer, a commercial polystyrene/polymethyl methacrylate block-copolymer (a product of Nippon Oil & Fats Co., Ltd., with the trade name MODIPER MS10B) as the copolymer B of the A-B-type block-copolymer, a commercial polyester resin (a product of Unichika, Ltd., with the trade name UE 3400) as the thermoplastic resin and a commercial product of electroconductive coated particles (a product of Sekisui Fine Chemicals K.K., with the trade name MICROPEARL AU) as the electroconductive particles in proportions as given in Tables 1 and 2 and coating the resulting blend on an exfoliative film in a layer at a dry thickness of 30 $\mu m$, low temperature-curable materials for anisotropically electroconductive connection were prepared in a form of sheet.

From each of the so-prepared sheets, a ribbon of a width of 2 mm was cut, which was placed between a tape carrier package (TCP) provided with electrodes arranged at an electrode interval of 200 $\mu m$ and a substrate glass board provided with an electrode pattern of indium tin oxide (ITO) having an electrode interval of 200 $\mu m$, whereupon the assemblage was pressed from both sides at a temperature of 140° C. under a press load of 2.94 MPa for 20 seconds. The resulting connected assemblies were tested for the electric continuity resistance of connection and for the bonding strength observed by a 90° lateral peeling before and after a weathering test (at 85° C. under a relative humidity of 85% for a duration-of 500 hours).

On the other hand, ribbons of a width of 2 mm were cut from each of the above-obtained sheet of the connecting material. 100 test samples were prepared by placing each ribbon between a TCP having electrodes disposed at an electrode interval of 50 μm and an ITO-patterned substrate glass board with an electrode interval of 50 μm and heat-pressing the resulting assemblage at 140° C., 2.94 MPa and 20 seconds. For these samples, tests for estimating the rate of occurrence of short-circuiting were carried out. Results are recited in Table 1.

From Table 1, it is seen that all the inventive Examples with the connecting sheet in which the polymerizable component subject to radical polymerization and the block-copolymer were incorporated showed higher bonding strengths and lower continuity resistance, whereas all the Comparative Examples without the use of these components showed inferior results in these features.

TABLE 1

|  | Example | | | | | | | | Comparative Example | | | | | |
| --- | --- | --- | --- | --- | --- | --- | --- | --- | --- | --- | --- | --- | --- | --- |
|  | 1 | 2 | 3 | 4 | 5 | 6 | 7 | 8 | 1 | 2 | 3 | 4 | 5 | 6 |
| Adhesive mass composition (part by weight) | | | | | | | | | | | | | | |
| Polymerizable compon. A | 30 | 30 | 30 | 30 | 25 | 20 | 30 | 30 | 30 | 31 | 20 | 40 | — | — |
| Polymerizable compon. B | 25 | 25 | 25 | 25 | 20 | 15 | 25 | 25 | 25 | 26 | — | — | 20 | 40 |
| Coupling agent | 2 | 2 | 2 | 2 | 2 | 2 | 2 | 2 | 2 | 2 | 2 | 2 | 2 | 2 |
| Peroxide | 3 | 3 | 3 | 3 | 3 | 3 | 3 | 3 | 3 | — | 3 | 3 | 3 | 3 |
| Block-copolymer A | 1 | 5 | 15 | 25 | 50 | 60 | — | 10 | — | — | — | — | — | — |
| Block-copolymer B | — | — | — | — | — | — | 15 | 10 | — | — | — | — | — | — |
| Thermoplastic resin | 39 | 35 | 25 | 15 | — | — | 25 | 20 | 40 | 41 | 75 | 55 | 75 | 55 |
| Electroconductive particle (vol. %) | 10 | 10 | 10 | 10 | 10 | 10 | 10 | 10 | 10 | 10 | 10 | 10 | 10 | 10 |
| Original value Elec. cont. resist. (Ω) | | | | | | | | | | | | | | |
| max. | 2.10 | 2.09 | 2.09 | 2.11 | 2.08 | 2.13 | 2.09 | 2.08 | 2.11 | >100 | 2.09 | 2.09 | 2.08 | 2.06 |
| min. | 1.34 | 1.35 | 1.35 | 1.33 | 1.29 | 1.32 | 1.33 | 1.29 | 1.35 | 5.81 | 1.34 | 1.35 | 1.35 | 1.33 |
| aver. | 1.88 | 1.85 | 1.91 | 1.89 | 1.85 | 1.93 | 1.88 | 1.85 | 1.89 | 78.1 | 1.88 | 1.89 | 1.88 | 1.89 |
| Bonding strength (N/cm) | 3.92 | 7.35 | 8.13 | 8.04 | 7.84 | 6.37 | 7.35 | 8.13 | 3.43 | 9.60 | 5.49 | 5.19 | 4.61 | 3.92 |
| After weathering test Elec. cont. resist. (Ω) | | | | | | | | | | | | | | |
| max. | 2.99 | 3.02 | 3.00 | 2.98 | 3.01 | 3.02 | 3.01 | 3.00 | 3.01 | >100 | 11.1 | 9.88 | 5.51 | 3.49 |
| min. | 1.34 | 1.35 | 1.35 | 1.33 | 1.31 | 1.33 | 1.35 | 1.31 | 1.35 | 7.11 | 1.34 | 1.35 | 1.35 | 1.34 |
| aver. | 2.00 | 2.01 | 2.01 | 1.99 | 1.99 | 2.00 | 2.01 | 2.00 | 2.00 | 99.8 | 4.88 | 3.34 | 3.29 | 2.35 |
| Bonding strength (N/cm) | 4.12 | 6.37 | 7.15 | 7.25 | 6.86 | 5.68 | 6.08 | 7.15 | 3.33 | 8.33 | 3.72 | 3.33 | 2.55 | 2.84 |
| Short-circuit. samples (No.) | — | — | 0 | — | — | — | 0 | — | 6 | — | — | — | — | — |

What is claimed is:

1. A low temperature-curable anisotropically electroconductive connecting material for connecting and bonding electronic elements together, said connecting material comprising an adhesive mass comprising:
   a polymerizable component capable of radical polymerization and cross-linking with itself;
   a polymerizable initiator; and
   a block copolymer having a first block segment compatible with the polymerizable component and a second block segment incompatible with the polymerizable component.

2. The connecting material as claimed in claim 1, wherein the adhesive mass comprises the polymerizable component capable of radical polymerization and a polymerizable coupling agent.

3. The connecting material as claimed in claim 1, wherein the block-copolymer is a polystyrene/polyvinyl acetate block-copolymer or a polystyrene/poly(meth)acrylate block-copolymer.

4. The connecting material as claimed in claim 1, wherein the adhesive mass contains the polymerizable component in a proportion of 10–90% by weight, the polymerization initiator in a proportion of 1–10% by weight and the block-copolymer in a proportion of 9–80% by weight.

5. The connecting material as claimed in claim 1, wherein the adhesive mass contains a thermoplastic resin in a proportion of 0–50% by weight.

6. The connecting material as claimed in claim 1, wherein it further comprises electroconductive particles in an amount of 0–50%, based on the volume of the adhesive mass.

7. An electronic component comprising:
   a first element having a plurality of electrodes provided thereon;
   a second element having a plurality of electrodes provided thereon which correspond to and confront the plurality of electrodes provided on the first element; and
   a low temperature-curable anisotropically electroconductive connecting material connecting and bonding the first and second elements together, said connecting material comprising an adhesive mass comprising a polymerizable component capable of radical polymerization and cross-linking with itself, a polymerization initiator, and a block copolymer having a first block segment compatible with the polymerizable component and a second block segment incompatible with the polymerizable component.

8. The electronic component of claim 7, wherein the connecting material further comprises electroconductive particles in an amount of 0–50%, based on the volume of the adhesive mass.

9. The electronic component of claim 7, wherein the electronic component comprises the polymerizable component capable of radical polymerization and a polymerizable coupling agent.

10. The electronic component of claim 7, wherein the block-copolymer is a polystyrene/polyvinyl acetate block-copolymer or a polystyrene/poly(meth)acrylate block-copolymer.

11. The electronic component of claim 7, wherein the adhesive mass contains the polymerizable component in a proportion of 10–90% by weight, the polymerization initiator in a proportion of 1–10% by weight and the block-copolymer in a proportion of 9–80% by weight.

12. The electronic component of claim 7, wherein the adhesive mass contains a thermoplastic resin in a proportion of 0–50% by weight.

* * * * *

UNITED STATES PATENT AND TRADEMARK OFFICE
CERTIFICATE OF CORRECTION

PATENT NO.   : 6,527,984 B1
DATED        : March 4, 2003
INVENTOR(S)  : Tomoyuki Ishimatsu It is certified that error appears in the above-identified patent and that said Letters Patent is hereby corrected as shown below:

Column 11,
Line 55, change "a polymerizable initiator" to -- a polymerization initiator --.

Signed and Sealed this

Ninth Day of September, 2003

JAMES E. ROGAN
*Director of the United States Patent and Trademark Office*